(12) United States Patent
Forray et al.

(10) Patent No.: US 7,176,044 B2
(45) Date of Patent: Feb. 13, 2007

(54) B-STAGEABLE DIE ATTACH ADHESIVES

(75) Inventors: Deborah Derfelt Forray, San Diego, CA (US); Puwei Liu, San Diego, CA (US); Benedicto delos Santos, San Diego, CA (US)

(73) Assignee: Henkel Corporation, Rocky Hill, CT (US)

( * ) Notice: Subject to any disclaimer, the term of this patent is extended or adjusted under 35 U.S.C. 154(b) by 424 days.

(21) Appl. No.: 10/459,601

(22) Filed: Jun. 12, 2003

(65) Prior Publication Data

US 2004/0102566 A1 May 27, 2004

Related U.S. Application Data

(60) Provisional application No. 60/428,724, filed on Nov. 25, 2002.

(51) Int. Cl.
G01R 31/26 (2006.01)

(52) U.S. Cl. .................. 438/15; 427/582; 257/787; 257/788

(58) Field of Classification Search .............. 438/6, 438/10–15, 104, 107–114, 118, 121–123, 438/128–129, 135, 142, 145, 149, 151, 157, 438/176, 478, 184, 193, 195–198, 200–203, 438/206–211, 218, 237, 165, 294, 308, 337, 438/353, 378
See application file for complete search history.

(56) References Cited

U.S. PATENT DOCUMENTS

| 2,928,446 A | 3/1960 | James et al. ................ 151/7 |
| 3,985,928 A | 10/1976 | Watanabe et al. ........... 428/273 |
| 4,325,985 A | 4/1982 | Wallace ..................... 427/54.1 |
| 4,412,048 A | 10/1983 | Dixon et al. |
| 4,632,944 A | 12/1986 | Thompson ................... 522/11 |
| 4,816,294 A * | 3/1989 | Tsuo et al. ................... 427/582 |
| 5,084,532 A | 1/1992 | Schenkel |
| 5,266,662 A | 11/1993 | Jakob et al. |
| 5,298,562 A | 3/1994 | Ceska et al. ................ 525/244 |
| 5,300,608 A | 4/1994 | Chu et al. .................... 528/14 |
| 5,323,060 A | 6/1994 | Fogal et al. ................. 257/777 |
| 5,447,988 A | 9/1995 | Dershem et al. ............ 524/780 |
| 5,789,757 A | 8/1998 | Husson, Jr. et al. ...... 252/183.11 |
| 5,962,854 A * | 10/1999 | Endo ........................ 250/349 |
| 5,973,166 A | 10/1999 | Mizori et al. ............... 548/548 |
| 6,034,194 A | 3/2000 | Dershem et al. ............ 526/262 |
| 6,034,195 A | 3/2000 | Dershem et al. ............ 526/262 |
| 6,063,828 A | 5/2000 | Ma et al. ...................... 522/96 |
| 6,187,886 B1 | 2/2001 | Husson, Jr. et al. ........ 526/262 |
| 6,265,530 B1 | 7/2001 | Herr et al. ................... 528/322 |
| 6,281,314 B1 | 8/2001 | Tong et al. ................. 526/262 |
| 6,316,566 B1 | 11/2001 | Ma et al. .................... 526/264 |

(Continued)

FOREIGN PATENT DOCUMENTS

EP 0553557 8/1993

(Continued)

*Primary Examiner*—Michael Lebentritt
*Assistant Examiner*—Andre' Stevenson
(74) *Attorney, Agent, or Firm*—Steven C. Bauman

(57) ABSTRACT

The present invention relates to b-stageable die attach adhesives, methods of preparing such adhesives, methods of applying such adhesives to the die and other substrate surfaces, and assemblies prepared therewith for connecting microelectronic circuitry.

35 Claims, 4 Drawing Sheets

U.S. PATENT DOCUMENTS

| | | | |
|---|---|---|---|
| 2003/0087479 A1 | 5/2003 | He et al. | 438/113 |
| 2003/0129438 A1 | 7/2003 | Becker et al. | 428/620 |
| 2005/0211555 A1* | 9/2005 | Archibald | 204/452 |

FOREIGN PATENT DOCUMENTS

| | | |
|---|---|---|
| JP | 5339429 | 12/1993 |
| JP | 11343465 | 12/1999 |
| JP | 2001 220571 | 8/2001 |
| JP | 2001 220556 | 2/2002 |
| WO | WO 00/57070 | 9/2000 |
| WO | 52016 | 6/2003 |
| WO | 52813 | 6/2003 |

* cited by examiner

B-STAGEABLE DIE ATTACH ADHESIVES

RELATED APPLICATION DATA

This application claims a priority filing date under 35 U.S.C. § 119(e) from U.S. Provisional Application No. 60/428,724, filed Nov. 25, 2002, the disclosure of which is hereby expressly incorporated herein by reference.

BACKGROUND OF THE INVENTION

1. Field of the Invention

The present invention relates to b-stageable die attach adhesives, methods of preparing such adhesives, methods of applying such adhesives to the die and other substrate surfaces, and assemblies prepared therewith for connecting microelectronic circuitry.

2. Brief Description of Related Technology

Bismaleimides occupy a prominent position in the spectrum of thermosetting resins, and a number of bismaleimides are commercially available. Bismaleimides have been used for the production of moldings and adhesive joints, heat-resistant composite materials, and high temperature coatings. More recently, Henkel Loctite Corporation has commercialized a number of products based in part on certain bismaleimides for the attachment of semiconductor chips to circuit boards, which have been well received commercially from within the microelectronic industry. These products are covered in one or more of U.S. Pat. No. 5,789,757 (Husson), U.S. Pat. No. 6,034,194 (Dershem), U.S. Pat. No. 6,034,195 (Dershem) and U.S. Pat. No. 6,187,886 (Husson).

It would be desirable to provide the die attach material in a b-stageable form, such as a wafer-applied or substrate-applied version thereof. Such a version would eliminate many of the storage, dispensing, handling and processing issues that exist when dispensing in a flowable form reactive adhesives, including die attach adhesives.

B-stageable of pre-applied adhesives themselves are not a new commercial entity. For instance, Henkel Loctite has a substantial business in pre-applied threadlocker adhesives, which involve (meth)acrylate chemistry, for use in connection with nut and bolt assemblies, curable by either a photocure mechanism, a heat cure mechanism, or combinations thereof, with an optional secondary anaerobic cure mechanism. See also U.S. Pat. Nos. 2,928,446, 4,325,985, 4,632,944 and 5,300,608.

In addition, pre-applied underfill encapsulants have also been designed and developed by Henkel Loctite (see International Patent Application No. PCT/US00/07494).

However, to date there has not been a b-stageable heat curable composition based on the combination of a liquid and a solid curable component, or articles of manufacture placed in commerce, such as a semiconductor chip or a semiconductor wafer, with such a b-stageable die attach adhesive preapplied thereon for application without the intermediate process steps for the microelectronics packaging or assembling end user attendant with a flowable die attach adhesive.

SUMMARY OF THE INVENTION

The present invention is directed to a b-stage curable composition, which includes a solid component heat curable at a first temperature; a liquid component, which is either heat curable at a second temperature or curable upon exposure to radiation in the electromagnetic spectrum; and a heat cure catalyst for the solid curable component.

The invention further provides a method for preparing the b-stageable heat curable composition, which includes providing a solid curable component heat curable at a first temperature, a liquid curable component, which is either heat curable at a second temperature or curable upon exposure to radiation in the electromagnetic spectrum, and a heat cure catalyst for the solid curable component; and mixing together the solid curable component, liquid curable component and the heat cure catalyst. The method here may further include exposing the composition to conditions favorable to effect cure of the liquid curable component, exposing the composition to a temperature condition sufficient to melt the solid curable component, and exposing the composition to a temperature condition sufficient to cure the melted, solid curable component.

The invention still further provides a method for adhesively attaching one substrate, such as a chip die, to another substrate, such as a circuit board or a another chip die, which includes applying the inventive composition to one of the substrates; exposing the composition-applied substrates to conditions favorable to effect cure of the liquid curable component thereof, thereby forming a b-staged curable film; exposing the b-staged curable film to a temperature condition sufficient to melt the solid curable component thereof; adjoining the substrates to form an assembly where the substrates are separated by the previously-applied composition; and exposing the curable film to a temperature condition sufficient to cure the melted, solid curable component.

Alternatively or additionally, the b-stageable heat curable composition may be preapplied onto one or more metallized contact pads located on the substrate.

The heat curing conditions for the b-staged film may involve subjecting the assembly to a temperature in the range of about 150° C. up to about 200° C. for a period of time of about 0.25 minutes up to about 2 minutes.

DETAILED DESCRIPTION OF THE INVENTION

Figure 1:
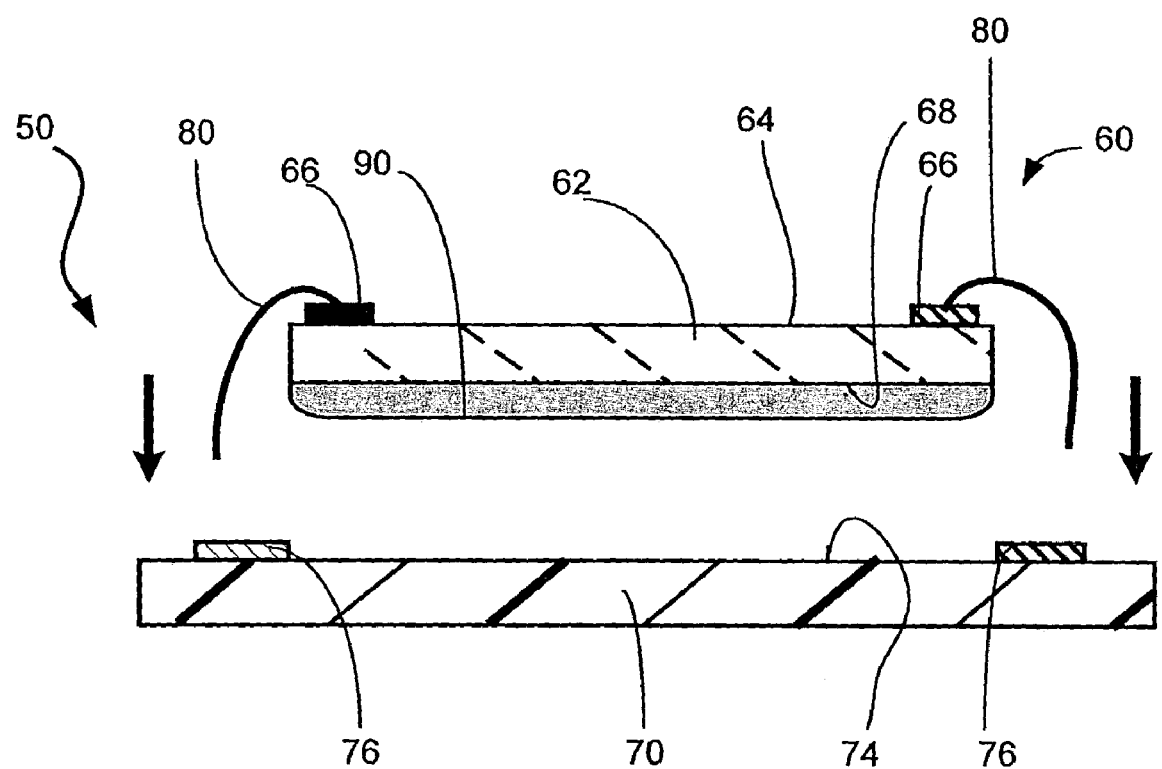
FIG. 1 is a schematic representation of a semiconductor chip in one embodiment of the present invention, prior to assembly with a substrate.

As the solid heat curable component, epoxies, episulfides, maleimides, itaconimides and nadimides are particularly desirable.

The epoxy resin in the solid state may include the monofunctional epoxy compounds: $C_4$–$C_{28}$ alkyl glycidyl ethers; $C_2$–$C_{28}$ alkyl- and alkenyl-glycidyl esters; and $C_1$–$C_{28}$ alkyl- and mono-phenol glycidyl ethers; as well as the multifunctional epoxy compounds: polyglycidyl ethers of pyrocatechol, resorcinol, hydroquinone, 4,4'-dihydroxydiphenyl methane (or bisphenol F, such as RE-303-S or RE-404-S available commercially from Nippon Kayuku, Japan), 4,4'-dihydroxy-3,3'-dimethyldiphenyl methane, 4,4'-dihydroxydiphenyl dimethyl methane (or bisphenol A), 4,4'-dihydroxydiphenyl methyl methane, 4,4'-dihydroxydiphenyl cyclohexane, 4,4'-dihydroxy-3,31-dimethyldiphenyl-propane, 4,4'-dihydroxydiphenyl sulfone, and tris(4-hydroxyphenyl)methane; polyglycidyl ethers of transition metal complexes; chlorination and bromination products of the above-mentioned diphenols; polyglycidyl ethers of novolacs; polyglycidyl ethers of diphenols obtained by esterifying ethers of diphenols obtained by esterifying salts of an aromatic hydrocarboxylic acid with a dihaloalkane or dihalogen dialkyl ether; polyglycidyl ethers of polyphenols obtained by condensing phenols and long-chain halogen paraffins containing at least two halogen atoms; N,N'-diglycidyl-aniline; N,N'-dimethyl-N,N'-diglycidyl-4,4'-diaminodiphenyl methane; N,N,N',N'-tetraglycidyl-4,4'-diaminodiphenyl methane; N,N'-diglycidyl-4-aminophenyl glycidyl ether; N,N,N',N'-tetraglycidyl-1,3-propylene bis-4-aminobenzoate; phenol novolac epoxy resin; cresol novolac epoxy resin; and combinations thereof.

Among the commercially available epoxy resins in the solid state suitable for use in the present invention are polyglycidyl derivatives of phenolic compounds, such as those available from Resolution Performance, under the EPON tradename, such as EPON 1009F [bisphenol A epoxy resin (CAS No. 25036-25-3)], EPON 1001F, EPON 1002F, EPON 1004F, EPON 1007F, EPON 3001, EPON 3002, EPON 2002, EPON 2003, EPON 2004, EPON 2005, EPON 2012, EPON 2014, EPON 2024, and EPON 2042; from Dow Chemical Co. under the DER trade designation, such as DER 331, DER 332, DER 383, DER 354, and DER 542; from Vantico Inc., Brewster, N.Y. under the ARALDITE tradename, such as ARALDITE [phenol-4,4'-(1-methylethylidene)bis with (chloromethyl)oxirane (CAS No. 25068-38-6)], ARALDITE ECN 1299 [formaldehyde, polymer with (chloromethyl)oxirane and 2-methylphenol, melting point 85-100° C. (CAS No. 29690-82-2)] and ARALDITE ECN 1285 [formaldehyde, polymer with (chloromethyl)oxirane and 2-methylphenol, melting point 80-90° C. (CAS No. 29690-82-2)], and ARALDITE GT 7097 US [(phenol, 4-(1,1-dimethylethyl), polymer with (chloromethyl)oxirane and 4,4'-(1-methylethylidene)bis, melting point 113-123° C. (CAS No. 67924-34-9)]; and from Nippon Kayaku, Japan, BREN-S. Other suitable epoxy resins include polyepoxides prepared from polyols and the like and polyglycidyl derivatives of phenol-formaldehyde novolacs, the latter of which are available commercially from Dow Chemical Company under the tradename DEN, such as DEN 431, DEN 438, and DEN 439.

Polyglycidyl adducts of amines, aminoalcohols and polycarboxylic acids are also useful in this invention, commercially available resins of which include GLYAMINE 135, GLYAMINE 125, and GLYAMINE 115 from BP Chemicals, LTD ARALDITE MY 720, ARALDITE MY 721, ARALDITE MY 0500, and ARALDITE MY 0510 from Vantico Inc.

Of course combinations of the different epoxy resins are also desirable for use herein.

In addition to epoxies, episulfides are desirable as well, whether they are full or partial episulfides, provided that they are in the solid state. Episulfides may be commercially available or readily prepared from the corresponding epoxy through known synthetic methods.

The maleimides, nadimides, and itaconimides in the solid state include those compounds having the following structures I, II and III, respectively

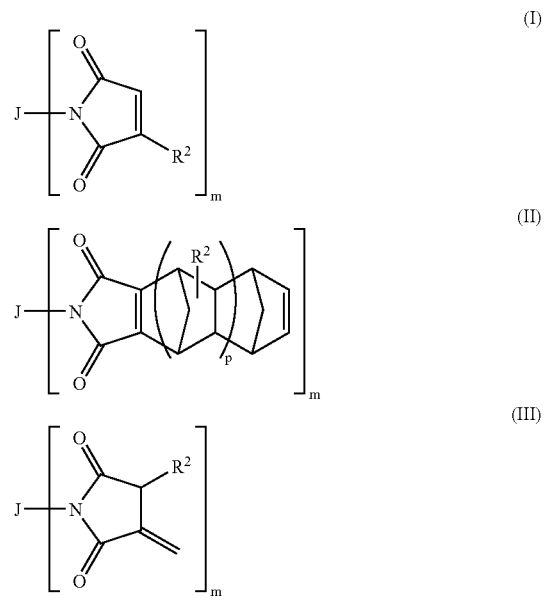

where:
m=1–15,
p=0–15,
each $R^2$ is independently selected from hydrogen or lower alkyl, and
J is a monovalent or a polyvalent moiety comprising organic or organosiloxane radicals, and combinations of two or more thereof.

More specific representations of the maleimides, itaconimides and nadimides in the solid state include those corresponding to structures I, II, or III, where
m=1–6,
p=0,
$R^2$ is independently selected from hydrogen or lower alkyl, and
J is a monovalent or polyvalent radical selected from hydrocarbyl, substituted hydrocarbyl, heteroatom-containing hydrocarbyl, substituted heteroatom-containing hydrocarbyl, hydrocarbylene, substituted hydrocarbylene, heteroatom-containing hydrocarbylene, substituted heteroatom-containing hydrocarbylene, polysiloxane, polysiloxane-polyurethane block copolymer, and combinations of two or more thereof, optionally containing one or more linkers selected from a covalent bond, —O—, —S—, —NR—, —O—C(O)—, —O—C(O)—O—, —O—C(O)—NR—, —NR—C(O)—, —NR—C(O)—O—, —NR—C(O)—NR—, —S—C(O)—, —S—C(O)—O—, —S—C(O)—NR—, —S(O)—, —S(O)$_2$—, —O—S(O)$_2$—, —O—S(O)$_2$—O—, —O—S(O)$_2$—NR—, —O—S(O)—, —O—S(O)—O—, —O—S(O)—NR—, —O—NR—C(O)—, —O—NR—C(O)—O—, —O—NR—C(O)—NR—, —NR—O—C(O)—, —NR—O—C(O)—O—, —NR—O—C(O)—NR—, —O—NR—C(S)—, —O—NR—C(S)—O—, —O—NR—C(S)—NR—, —NR—O—C(S)—, —NR—O—C(S)—O—, —NR—O—C(S)—NR—, —O—C(S)—, —O—C(S)—O—, —O—C(S)—NR—, —NR—C(S)—, —NR—C(S)—O—, —NR—C(S)—NR—, —S—S(O)$_2$—, —S—S(O)$_2$—O—, —S—S(O)$_2$—NR—, —NR—O—S(O)—, —NR—O—S(O)—O—, —NR—O—S(O)—NR—, —NR—O—S(O)$_2$—, —NR—O—S(O)$_2$—O—, —NR—O—S(O)$_2$—NR—, —O—NR—S(O)—, —O—NR—S(O)—O—, —O—NR—S(O)—NR—, —O—NR—S(O)$_2$—O—, —O—NR—S(O)$_2$—NR—, —O—NR—S(O)$_2$—, —O—P(O)R$_2$O—, —S—P(O)R$_2$—, —NR—P(O)R$_2$—, where each R is independently hydrogen, alkyl or substituted alkyl, and combinations of any two or more thereof.

When one or more of the above described monovalent or polyvalent groups contain one or more of the above described linkers to form the "J" appendage of a maleimide, nadimide or itaconimide group, as readily recognized by those of skill in the art, a wide variety of linkers can be produced, such as, for example, oxyalkyl, thioalkyl, aminoalkyl, carboxyalkyl, oxyalkenyl, thioalkenyl, aminoalkenyl, carboxyalkenyl, oxyalkynyl, thioalkynyl, aminoalkynyl, carboxyalkynyl, oxycycloalkyl, thiocycloalkyl, aminocycloalkyl, carboxycycloalkyl, oxycloalkenyl, thiocloalkenyl, aminocycloalkenyl, carboxycycloalkenyl, heterocyclic, oxyheterocyclic, thioheterocyclic, aminoheterocyclic, carboxyheterocyclic, oxyaryl, thioaryl, aminoaryl, carboxyaryl, heteroaryl, oxyheteroaryl, thioheteroaryl, aminoheteroaryl, carboxyheteroaryl, oxyalkylaryl, thioalkylaryl, aminoalkylaryl, carboxyalkylaryl, oxyarylalkyl, thioarylalkyl, aminoarylalkyl, carboxyarylalkyl, oxyarylalkenyl, thioarylalkenyl, aminoarylalkenyl, carboxyarylalkenyl, oxyalkenylaryl, thioalkenylaryl, aminoalkenylaryl, carboxyalkenylaryl, oxyarylalkynyl, thioarylalkynyl, aminoarylalkynyl, carboxyarylalkynyl, oxyalkynylaryl, thioalkynylaryl, aminoalkynylaryl or carboxyalkynylaryl, oxyalkylene, thioalkylene, aminoalkylene, carboxyalkylene, oxyalkenylene, thioalkenylene, aminoalkenylene, carboxyalkenylene, oxyalkynylene, thioalkynylene, aminoalkynylene, carboxyalkynylene, oxycycloalkylene, thiocycloalkylene, aminocycloalkylene, carboxycycloalkylene, oxycycloalkenylene, thiocycloalkenylene, aminocycloalkenylene, carboxycycloalkenylene, oxyarylene, thioarylene, aminoarylene, carboxyarylene, oxyalkylarylene, thioalkylarylene, aminoalkylarylene, carboxyalkylarylene, oxyarylalkylene, thioarylalkylene, aminoarylalkylene, carboxyarylalkylene, oxyarylalkenylene, thioarylalkenylene, aminoarylalkenylene, carboxyarylalkenylene, oxyalkenylarylene, thioalkenylarylene, aminoalkenylarylene, carboxyalkenylarylene, oxyarylalkynylene, thioarylalkynylene, aminoarylalkynylene, carboxy arylalkynylene, oxyalkynylarylene, thioalkynylarylene, aminoalkynylarylene, carboxyalkynylarylene, heteroarylene, oxyheteroarylene, thioheteroarylene, aminoheteroarylene, carboxyheteroarylene, heteroatom-containing di- or polyvalent cyclic moiety, oxyheteroatom-containing di- or polyvalent cyclic moiety, thioheteroatom-containing di- or polyvalent cyclic moiety, aminoheteroatom-containing di- or polyvalent cyclic moiety, carboxyheteroatom-containing di- or polyvalent cyclic moiety, disulfide, sulfonamide, and the like.

In another embodiment, maleimides, nadimides, and itaconimides contemplated for use in the practice of the present invention have the structures I, II, or III, where m=1–6, p=0–6, and J is selected from saturated straight chain alkyl or branched chain alkyl, optionally containing optionally substituted aryl moieties as substituents on the alkyl chain or as part of the backbone of the alkyl chain, and where the alkyl chains have up to about 20 carbon atoms;

a siloxane having the structure: —(C(R$^3$)$_2$)$_d$—[Si(R$^4$)$_2$—O]$_f$—Si(R$^4$)$_2$—(C(R$^3$)$_2$)$_e$—, —(C(R$^3$)$_2$)$_d$C(R$^3$)—C(O)O—(C(R$^3$)$_2$)$_d$—[Si(R$^4$)$_2$—O]$_f$—Si(R$^4$)$_2$—(C(R$^3$)$_2$)$_e$—O(O)C—(C(R$^3$)$_2$)$_e$—, or —(C(R$^3$)$_2$)$_d$—C(R$^3$)—O(O)C—(C(R$^3$)$_2$)$_d$—[Si(R$^4$)$_2$—O]$_f$—Si(R$^4$)$_2$—(C(R$^3$)$_2$)$_e$—C(O)O—(C(R$^3$)$_2$)$_e$—, where:

each R$^3$ is independently hydrogen, alkyl or substituted alkyl, each R$^4$ is independently hydrogen, lower alkyl or aryl, d=1–10, e=1–10, and f=1–50;

a polyalkylene oxide having the structure:

$$[(CR_2)_r—O—]_f—(CR_2)_s—$$

where:

each R is independently hydrogen, alkyl or substituted alkyl, r 1–10, s=1–10, and f is as defined above;

aromatic groups having the structure:

$$Ar—\overset{O}{\overset{\|}{C}}—O—Z—O—\overset{O}{\overset{\|}{C}}—Ar—$$

where:

each Ar is a monosubstituted, disubstituted or trisubstituted aromatic or heteroaromatic ring having in the range of 3 up to 10 carbon atoms, and Z is:

saturated straight chain alkylene or branched chain alkylene, optionally containing saturated cyclic moieties as substituents on the alkylene chain or as part of the backbone of the alkylene chain, or polyalkylene oxides having the structure:

$$—[(CR_2)_r—O—]_q—(CR_2)_s—$$

where:

each R is independently hydrogen, alkyl or substituted alkyl, r and s are each defined as above, and q falls in the range of 1 up to 50;

di- or tri-substituted aromatic moieties having the structure:

$$——(CR_2)_t—O—\overset{O}{\overset{\|}{C}}—Ar—\left[\overset{O}{\overset{\|}{C}}—O—(CR_2)_u\right]_{1,2}$$

where:

each R is independently hydrogen, alkyl or substituted alkyl, t falls in the range of 2 up to 10, u falls in the range of 2 up to 10, and Ar is as defined above;

aromatic groups having the structure:

$$——Ar—[O(C)_{0,1}—(CR_2)_t]_k, \quad ——Ar—[(\overset{O}{\overset{\|}{C}})_{0,1}—O—(CR_2)_t]_k,$$

-continued

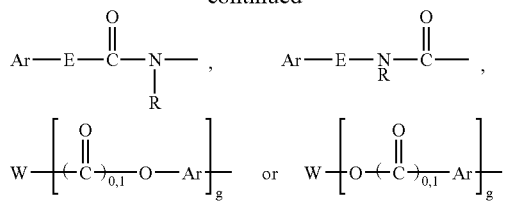

where:
each R is independently hydrogen, alkyl or substituted alkyl,
t=2–10,
k=1, 2 or 3,
g=1 up to about 50,
each Ar is as defined above,
E is —O— or —NR$^5$—, where R$^5$ is hydrogen or lower alkyl; and
W is straight or branched chain alkyl, alkylene, oxyalkylene, alkenyl, alkenylene, oxyalkenylene, ester, or polyester, a siloxane having the structure —(C(R$^3$)$_2$)$_d$—[Si (R$^4$)$_2$—O]$_f$—Si(R$^4$)$_2$—(C(R$^3$)$_2$)$_e$—, —(C(R$^3$)$_2$)$_d$—C(R$^3$)═C(O)O—(C(R$^3$)$_2$)$_d$—[Si(R$^4$)$_2$O—O]$_f$—Si(R$^4$)$_2$—(C(R$^3$)$_2$)$_e$—O(O)C— (C(R$^3$)$_2$)$_e$—, or —(C(R$^3$)$_2$)$_d$—C(R$^3$)═O(O)C—(C(R$^3$)$_2$)$_d$—[Si(R$^4$)$_2$—O]$_f$—Si(R$^4$)$_2$—(C(R$^3$)$_2$)—C(O)—(C(R$^3$)$_2$)$_e$—,
where:
each R$^3$ is independently hydrogen, alkyl or substituted alkyl,
each R$^4$ is independently hydrogen, lower alkyl or aryl,
d=1–10,
e=1–10, and
f=1–50; or
a polyalkylene oxide having the structure:

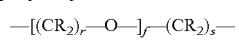

where:
each R is independently hydrogen, alkyl or substituted alkyl,
r=1–10,
s=1–10, and
f is as defined above;
optionally containing substituents selected from hydroxy, alkoxy, carboxy, nitrile, cycloalkyl or cycloalkenyl;
a urethane group having the structure:

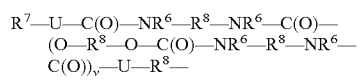

where:
each R$^6$ is independently hydrogen or lower alkyl,
each R$^7$ is independently an alkyl, aryl, or arylalkyl group having 1 to 18 carbon atoms,
each R$^8$ is an alkyl or alkyloxy chain having up to about 100 atoms in the chain, optionally substituted with Ar,
U is —O—, —S—, —N(R)—, or —P(L)$_{1,2}$-,
where R as defined above, and where each L is independently ═O, ═S, —OR or —R; and
v=0–50;
polycyclic alkenyl; or mixtures of any two or more thereof.

The maleimide-, nadimide-, and itaconimide-containing compounds useful as the solid curable component are chosen of course such that they are in the solid state and have a melting point between 90° C. and 160° C.

Particularly desirable maleimides compounds for use as the solid component of the b-stageable die attach adhesive of the present invention include, for example, maleimides having the following structures:

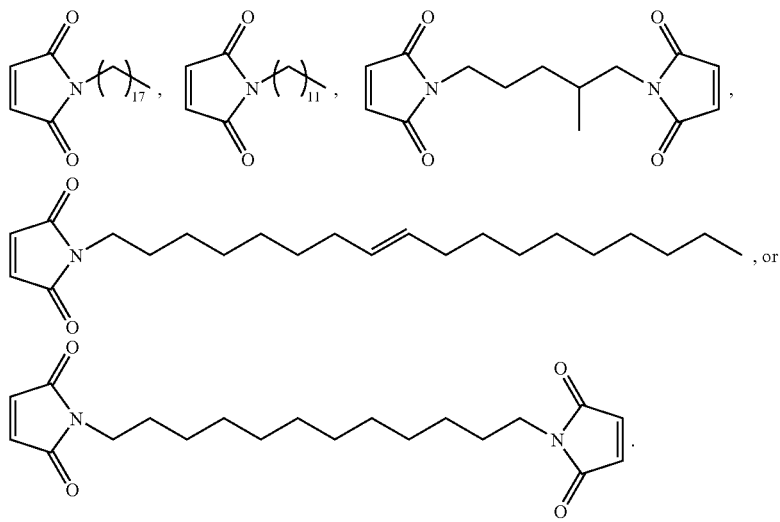

As the liquid curable component, epoxies, episulfides, maleimides, nadimides, itaconimides, (meth)acrylates, maleates, fumarates, vinyl ethers, vinyl esters, allyl amides, styrene and derivatives thereof, poly(alkenylene)s, norbornenyls, thiolenes and the like are particularly desirable.

The epoxies in the liquid state that may be used herein include those also available commercially from Resolution Performance under the EPON tradename, such as EPON 825, EPON 826, EPON 828, EPON 862, EPON 8019, EPON 8101, EPON 8112, EPON 813, EPON 8131, EPON 8132, EPON 8133, EPON 815C, and EPON 824.

For the maleimide-, nadimide- and/or itaconimide-containing compounds, provided the functional group of the maleimide-, nadimide- and/or itaconimide-containing compound, respectively, is attached to a monovalent radical, J, or separated by a polyvalent radical, J, each of the monovalent radical or the polyvalent radical having sufficient length and branching to render the maleimide-, nadimide- and/or itaconimide-containing compound a liquid, such a compound is suitable for use as the liquid curable component.

In a more specific recitation of such maleimide-, nadimide-, and itaconimide-containing compounds of structures I, II and III, each R is independently hydrogen or lower alkyl, -J- comprises a branched chain alkyl, alkylene or alkylene oxide species having sufficient length and branching to render the maleimide, nadimide and/or itaconimide compound a liquid, and m is 1, 2 or 3.

The maleimide-, nadimide- or itaconimide-containing compound useful as the liquid component of the present invention may be chosen from those described and claimed in U.S. Pat. No. 5,789,757 (Husson), U.S. Pat. No. 6,034,194 (Dershem), U.S. Pat. No. 6,034,195 (Dershem) and U.S. Pat. No. 6,187,886 (Husson), the disclosures of each of which are hereby incorporated herein by reference, and those described by U.S. Pat. No. 6,063,828 (Ma), U.S. Pat. No. 6,265,530 (Herr), U.S. Pat. No. 6,281,314 (Tong) and U.S. Pat. No. 6,316,566 (Ma), the disclosures of each of which are hereby incorporated herein by reference, as well.

The (meth)acrylates may be chosen from a host of different compounds. As used herein, the terms (meth)acrylic and (meth)acrylate are used synonymously with regard to the monomer and monomer-containing component. The terms (meth)acrylic and (meth)acrylate include acrylic, methacrylic, acrylate and methacrylate.

The (meth)acrylate component may comprise one or more members selected from a monomer represented by the formula:

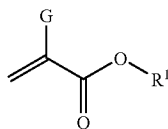

where G is hydrogen, halogen, or an alkyl having from 1 to 4 carbon atoms, $R^1$ has from 1 to 16 carbon atoms and is an alkyl, cycloalkyl, alkenyl, cycloalkenyl, alkaryl, aralkyl, or aryl group, optionally substituted or interrupted with silane, silicon, oxygen, halogen, carbonyl, hydroxyl, ester, carboxylic acid, urea, urethane, carbamate, amine, amide, sulfur, sulfonate, or sulfone;

urethane acrylates or ureide acrylates represented by the formula:

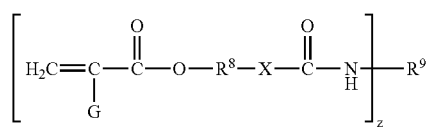

where

G is hydrogen, halogen, or an alkyl having from 1 to 4 carbon atoms;

$R^8$ denotes a divalent aliphatic, cycloaliphatic, aromatic, or araliphatic group, bound through a carbon atom or carbon atoms thereof indicated at the —O— atom and —X— atom or group;

X is —O—, —NH—, or —N(alkyl)-, in which the alkyl radical has from 1 to 8 carbon atoms;

z is 2 to 6; and $R^9$ is a z-valent cycloaliphatic, aromatic, or araliphatic group bound through a carbon atom or carbon atoms thereof to the one or more NH groups; and a di- or tri-(meth)acrylate selected from polyethylene glycol di(meth)acrylates, bisphenol-A di(meth)acrylates, tetrahydrofurane di(meth)acrylates, hexanediol di(meth)acrylate, trimethylol propane tri(meth)acrylate, or combinations thereof.

Suitable polymerizable (meth)acrylate monomers include triethylene glycol di(meth)acrylate, tripropylene glycol di(meth)acrylate, tetraethylene glycol di(meth)acrylate, diethylene glycol di(meth)acrylate, 1,4-butanediol di(meth)acrylate, 1,6-hexanediol di(meth)acrylate, pentaerythritol tetra(meth)acrylate, trimethylol propane tri(meth)acrylate, di-pentaerythritol monohydroxypenta(meth)acrylate, pentaerythritol tri(meth)acrylate, bisphenol-A-ethoxylate di(meth)acrylate, trimethylolpropane ethoxylate tri(meth)acrylate, trimethylolpropane propoxylate tri(meth)acrylate, and bisphenol-A-diepoxide di(meth)acrylate.

Additionally, mono-functional (meth)acrylate monomers may be used, including tetrahydrofurane (meth)acrylates and di(meth)acrylates, citronellyl (meth)acrylate, hydroxypropyl (meth)acrylate, tetrahydrodicyclopentadienyl (meth)acrylate, triethylene glycol (meth)acrylate, triethylene glycol (meth)acrylate, and combinations thereof.

Of course, (meth)acrylated silicones may also be used, provided the silicone backbone is not so large so as to minimize the effect of (meth)acrylate when cure occurs.

Other (meth)acrylates suitable for use herein include the low viscosity acrylates disclosed and claimed in U.S. Pat. No. 6,211,320 (Dershem), the disclosure of which is expressly incorporated herein by reference.

The fumarates include those comprising the following general structure:

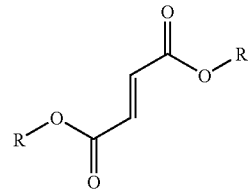

The maleates include those comprising the following general structure:

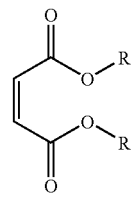

R for each of the fumarates and maleates may be selected from $R^1$ as defined above.

The vinyl ethers and vinyl esters include those comprising the following general structure:

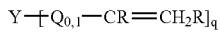

where
  q is 1, 2 or 3,
  each R is independently as defined above for $R^1$, each Q is independently selected from —O—, —O(O)C—, —C(O)— or —C(O)—O—, and
  Y is defined as X with respect to structures I, II and III above.

Examples of vinyl ethers or vinyl esters embraced by the above generic structure include stearyl vinyl ether, behenyl vinyl ether or ester, eicosyl vinyl ether or ester, isoeicosyl vinyl ether or ester, isotetracosyl vinyl ether or ester, poly(tetrahydrofuran) divinyl ether or ester, tetraethylene glycol divinyl ether or ester, tris-2,4,6-(1-vinyloxybutane-4-oxy-1,3,5-triazine, bis-1,3-(1-vinyloxybutane-4-)-oxycarbonylbenzene (alternately referred to as bis(4-vinyloxybutyl) isophthalate; available from Allied-Signal Inc., Morristown, N.J., under the trade name VECTOMER 4010), divinyl ethers prepared by transvinylation between lower vinyl ethers and higher molecular weight di-alcohols. Particularly desirable divinyl resins include stearyl vinyl ether or ester, behenyl vinyl ether or ester, eicosyl vinyl ether or ester, isoeicosyl vinyl ether or ester, poly(tetrahydrofuran) divinyl ether or ester, divinyl ethers prepared by transvinylation between lower vinyl ethers and higher molecular weight di-alcohols.

As the allyl amides, a variety of compounds may be chosen, such as those satisfying the criteria set forth above for "J" with respect to the maleimides, itaconimides and/or nadimides. For instance, in a more specific representation, those corresponding to the following structure:

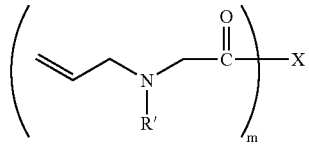

where
  R' is hydrogen, $C_1$ up to about $C_{1-8}$ alkyl or oxyalkyl, allyl, aryl, or substituted aryl,
  m is 1–6, and
  X is as defined above for J.

The styrene-containing component include those comprising the following general structure:

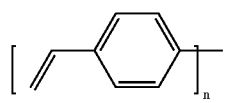

where n is 1–6, attached to X as defined above.

The norbornenyl component include those comprising the following general structure:

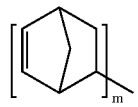

where m is is 1–6, attached to X as defined above.

The thiolene component include those comprising the following general structure:

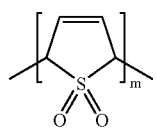

where m is is 1–6, attached to X as defined above.

The first temperature at which the solid component is curable should be greater than or equal to the temperature (or temperature range) at which the solid component melts—i.e., changes from the solid state to the liquid state. Ordinarily, this temperature should be within the range of about 100° C. to about 300° C., though desirably the temperature is above about 100° C. These different temperature ranges provides the formulator with a wide array of possibilities when preparing a composition within the scope of this invention, particularly where a particular set of physical property parameters are desirable or specified.

A heat cure catalyst may be included in the composition to reduce the temperature at which cure occurs or hasten the degree of cure when the appropriate temperature condition is selected for cure to occur.

The heat cure catalyst may be chosen from free radical catalysts, anionic curatives, cationic curatives, and combinations thereof. For instance, the free radical catalyst may be chosen from peroxides, azo compounds, and combinations thereof. Particularly desirable peroxide catalysts include dicumyl peroxide, dibenzoyl peroxide, 2-butanone peroxide, tert-butyl perbenzoate, di-tert-butyl peroxide, 2,5-bis(tert-butylperoxy)-2,5-dimethylhexane, bis(tert-butyl peroxyisopropyl)benzene, and tert-butyl hydroperoxide, and azo compounds include 2,2'-azobis(2-methylpropanenitrile), 2,2'-azobis(2-methylbutanenitrile), and 1,1'-azobis(cyclohexanecarbonitrile).

Commercially available examples of these free radical catalysts include those promoted by Akzo Nobel, such as the following peroxides dl-isobutyryl peroxide (CAS No. 3437-84-1), cumyl peroxyneodecanoate (CAS No. 26748-47-0), peroxydicarbonate mixture (CAS No. 105-64-6; 19910-65-7; 78350-78-4), 2,4,2-trimethylpentyl-2 peroxyneodecanoate (CAS No. 51240-95-0), cumyl peroxyneoheptanoate (CAS No. 68299-16-1), di-sec-butyl peroxydicarbonate (CAS No. 19910-65-7), tert-butylperoxyneodecanoate (CAS No. 26748-41-4), dibutyl peroxydicarbonate (CAS No. 16215-49-9), dicetyl peroxydicarbonate (CAS No. 26332-14-5), di(4-tert-butylcyclohexyl) peroxydicarbonate (CAS No. 15520-11-3), di(2-ethylhexyl) peroxydicarbonate (CAS No. 16111-62-9), dimyristyl peroxydicarbonate (CAS No. 53220-22-7), tert-butyl peroxyneoheptanoate (CAS No. 26748-38-9), tert-amyl peroxypivalate (CAS No. 29240-17-3), tert-butyl peroxypivalate (CAS No. 927-07-1), di-(3,5,5-trimethylhexanoyl) peroxide (CAS No. 3851-87-4), dilauroyl peroxide (CAS No. 105-74-8), dioctanoyl peroxide (CAS No. 762-16-3), didecanoyl peroxide (CAS No. 762-12-9), 2,5-dimethyl-2,5-di(2-ethyl-hexanoylperoxy)hexane (CAS No. 13052-09-0), tert-amyl peroxy-2-ethylhexanoate (CAS No. 686-31-7), tert-butyl peroxy-2-ethylhexanoate (CAS No. 3006-82-4), dibenzoyl peroxide (CAS No. 94-36-0), 1,1-di(tert-butylperoxy)-3,3,5-trimethylcyclohexane (CAS No. 6731-36-8), 2,2-bis[4,4-di-(tertbutyl-peroxy-cyclohexyl)propane] (CAS No. 1705-60-8), 1,1-di(tert-amylperoxy)cyclohexane (CAS No. 15667-10-4), 1,1-di(tert-butylperoxy)cyclohexane (CAS No. 3006-86-8), tert-amyl peroxy 2-ethylhexyl carbonate (CAS No. 70833-40-8), tert-butyl peroxy-3,5,5-trimethyl-hexanoate (CAS No. 13122-18-4), tert-butyl peroxy-2-methylbenzoate (CAS No. 22313-62-8) 2,2-di-(tert-butylperoxy)butane (CAS No. 2167-23-9), tert-butyl peroxy isopropyl carbonate (CAS No. 2372-21-6), tert-butyl peroxy 2-ethylhexyl carbonate (CAS No. 34443-12-4), tert-amyl peroxybenzoate (CAS No. 4511-39-1), tert-butyl peroxyacetate (CAS No. 107-71-1), butyl 4,4-di-(tert-butylperoxy) valerate (CAS No. 995-33-5), tert-butyl peroxybenzoate (CAS No. 614-45-9), di-tert-amyl peroxide (CAS No. 10508-09-5), dicumyl peroxide (CAS No. 80-43-3), di-(tert-butylperoxyisopropyl)benzene (CAS No. 25155-25-3), 2,5-dimethyl-2,5-di(tert-butylperoxy)hexane (CAS No. 78-63-7), tert-butyl cumyl peroxide (CAS No. 3457-61-2), 2,5-dimethyl-2,5-di(tertbutylperoxy)hexyne-3 (CAS No. 1068-27-5), di-tert-butyl peroxide (CAS No. 110-05-4), 3,6,9-triethyl-3,6,9-trimethyl-1,4,7-triperoxonane (CAS No. 24748-23-0), 1,1,3,3-tetramethylbutyl hydroperoxide (CAS No. 5809-08-5), diisopropylbenzene monohydroperoxide (CAS No. 26762-93-6), cumyl hydroperoxide (CAS No. 80-15-9), tert-butyl hydroperoxide (CAS No. 75-91-2), and tert-amyl hydroperoxide (CAS No. 3425-61-4), and the following azo compounds 2,2'-azobis(isobutyronitrile) (CAS No. 78-67-1), 2,2'-azobis(2-methylbutyronitrile) (CAS No. 13472-08-7), and 1,1'azobis(1-cyclohexanenitrile) (CAS No. 2094-98-6).

The heat cure catalyst may also be an anionic curative, such as those broadly described as aza compounds, amine compounds, amide compounds, imidazole compounds, and combinations thereof. More specific examples of aza compounds include

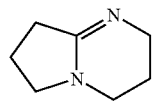

1,5-Diazabicyclo [4.3.0]non-5-ene

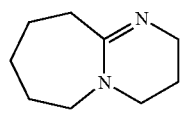

1,8-Diazabicyclo [5.4.0]undec-5-ene (DBU)

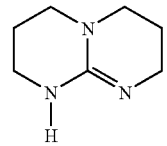

1,5,7-Triazabicyclo [4.4.0]dec-5-ene

Quinuclidine

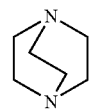

1,4-Diazabicyclo [2.2.2]octane

More specific examples of amine compounds include aliphatic polyamines, aromatic polyamines, alicyclic polyamines, such as diethylenetriamine, triethylenetetraamine, diethylaminopropylamine, benzyl dimethylamine, m-xylenediamine, diaminodiphenylamine, quinoxaline, isophoronediamine, menthenediamine and combinations thereof.

A more specific example of an amide compound is the functionalized amide, dicyandiamide.

More specific examples of imidazole compounds include isoimidazole, imidazole, 2-ethyl-4-methylimidazole, 2,4-dimethylimidazole, butylimidazole, 2-heptadecenyl-4-methylimidazole, 2-methylimidazole, 2-undecenylimidazole, 1-vinyl-2-methylimidazole, 2-undecylimidazole, 2-heptadecylimidazole, 2-phenylimidazole, 1-benzyl-2-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazole, addition products of an imidazole and methylimidazole, addition products of an imidazole and trimellitic acid, 2-n-heptadecyl-4-methylimidazole, phenylimidazole, benzylimidazole, 2-methyl-4,5-diphenylimidazole, 2,3,5-triphenylimidazole, 2-styrylimidazole, 1-(dodecyl benzyl)-2-methylimidazole, 2-(2-hydroxyl-4-t-butylphenyl)-4,5-diphenylimidazole, 2-(2-methoxyphenyl)-4,5-diphenylimidazole, 2-(3-hydroxyphenyl)-4,5-diphenylimidazole, 2-(p-dimethylaminophenyl)-4,5-diphenylimidazole, 2-(2-hydroxyphenyl)-4,5-diphenylimidazole, di(4,5-diphenyl-2-imidazole)-benzene-1,4,2-naphthyl-4,5-diphenylimidazole, 1-benzyl-2-methylimidazole, 2-p-methoxystyrylimidazole, and combinations thereof.

The heat cure catalyst may also be a cationic curative, such as those broadly described as organic acids, anhydrides, and Lewis acids. The organic acids include phenols, thiophenols, thiols, carboxylic acids, and combinations thereof. The anhydrides include among others hexahydrophthalic anhydride, methyl hexahydrophthalic anhydride, 5-(2,5-dioxotetrahydrol)-3-methyl-3-cyclohexene-1,2-dicarboxylic anhydride, and combinations thereof. The Lewis acids include a variety of materials known in the art as Lewis acids, examples of which are phosphines, alkyl halides, phosphorous esters, boron trifluoride etherate and the like.

The liquid component is either heat curable at a second temperature, different from the first temperature, or curable upon exposure to radiation in the electromagnetic spectrum. The second temperature oftentimes is within the range of about 50° C. to about 150° C., though desirably the temperature is less than about 100° C.

As above, another heat cure catalyst may be included in the composition to reduce the temperature at which cure of the liquid component occurs or hasten the degree of cure of the liquid component when the appropriate temperature condition is selected for cure to occur. Those heat cure catalysts recited above are suitable as the another heat cure catalyst, provided they catalyze reaction of or react with the liquid component at the indicated temperature.

In the event that it is desirable for certain commercial applications to cure the liquid component by exposure to radiation in the electromagnetic spectrum, a photoinitiator should also be included in the composition. The photoinitiator should be chosen with an eye toward the range of radiation in the electromagnetic spectrum at which cure is to be triggered. For instance, suitable ranges of radiation in the electromagnetic spectrum include UV, UV/VIS, VIS, IR, E-beam, X-ray, and microwave radiation.

Representative examples of UV and UV/VIS photoinitiators include those available commercially from Ciba Specialty Chemicals, Tarrytown, N.Y. under the "IRGACURE" and "DAROCUR" tradenames, specifically "IRGACURE" 184 (1-hydroxycyclohexyl phenyl ketone), 907 (2-methyl-1-[4-(methylthio)phenyl]-2-morpholino propan-1-one), 369 (2-benzyl-2-N,N-dimethylamino-1-(4-morpholinophenyl)-1-butanone), 500 (the combination of 1-hydroxy cyclohexyl phenyl ketone and benzophenone), 651 (2,2-dimethoxy-2-phenyl acetophenone), 1700 (the combination of bis(2,6-dimethoxybenzoyl-2,4,4-trimethyl pentyl) phosphine oxide and 2-hydroxy-2-methyl-1-phenyl-propan-1-one), and 819 [bis(2,4,6-trimethyl benzoyl) phenyl phosphine oxide] and "DAROCUR" 1173 (2-hydroxy-2-methyl-1-phenyl-1-propane) and 4265 (the combination of 2,4,6-trimethylbenzoyl-diphenyl-phosphine oxide and 2-hydroxy-2-methyl-1-phenyl-propan-1-one); and the visible light [blue] photoinitiators, dl-camphorquinone and "IRGACURE" 784DC. Of course, combinations of these materials may also be employed herein.

Other photoinitiators useful herein include alkyl pyruvates, such as methyl, ethyl, propyl, and butyl pyruvates, and aryl pyruvates, such as phenyl, benzyl, and appropriately substituted derivatives thereof.

Photoinitiators particularly well-suited for use herein include ultraviolet photoinitiators, such as 2,2-dimethoxy-2-phenyl acetophenone (e.g., "IRGACURE" 651), and 2-hydroxy-2-methyl-1-phenyl-1-propane (e.g., "DAROCUR" 1173), bis(2,4,6-trimethyl benzoyl) phenyl phosphine oxide (e.g., "IRGACURE" 819), and the ultraviolet/visible photoinitiator combination of bis(2,6-dimethoxybenzoyl-2,4,4-trimethylpentyl) phosphine oxide and 2-hydroxy-2-methyl-1-phenyl-propan-1-one (e.g., "IRGACURE" 1700), as well as the visible photoinitiator bis ([5-2,4-cyclopentadien-1-yl)-bis[2,6-difluoro-3-(1H-pyrrol-1-yl)phenyl]titanium (e.g., "IRGACURE" 784DC).

Additional photoinitiators may be chosen from those available from Sartomer, Inc., Exton, Pa. under the tradenames "ESACURE" and "SARCAT". Examples include "ESACURE" KB1 (benzil dimethyl ketal), "ESACURE" EB3 (mixture of benzoin and butyl ethers), "ESACURE" TZT (trimethylbenzophenone blend), "ESACURE" KIP100F (hydroxy ketone), "ESACURE" KIP150 (polymeric hydroxy ketone), "ESACURE" KT37 (blend of "ESACURE" TZT and KIP150), "ESACURE" KT046 (blend of triphenyl phosphine oxide, "ESACURE" KIP150 and TZT), and "ESACURE" X33 (blend of 2- and 4-isopropylthioxanthone, ethyl 4-(dimethyl amino) benzoate and "ESACURE" TZT].

Of course, combinations of such photoinitiators may be used as deemed appropriate by those of ordinary skill in the art.

In addition, the photoinitiator may be a cationic one, which is capable of catalyzing the polymerization of the liquid component of the inventive compositions, upon exposure to appropriate radiation conditions. Desirable cationic photoinitiators for use with the present invention include triarylsulfonium and diaryliodonium salts containing non-nucleophilic counterions and aryl diazonium salts, examples of which include 4-methoxybenzenediazonium hexafluorophosphate, benzenediazonium tetrafluoroborate, diphenyl iodonium chloride, diphenyl iodonium hexafluorophosphate, 4,4-dioctyloxydiphenyl iodonium hexafluorophosphate, triphenylsulfonium tetrafluoroborate, diphenyltolyl-sulfonium hexafluorophosphate, phenylditolylsulfonium hexafluoroarsenate, and diphenyl-thiophenoxyphenylsulfonium hexafluoroantimonate, and those commercially available from Sartomer, such as "SARCAT" CD 1010 [triaryl sulfonium hexafluoroantimonate (50% in propylene carbonate)], "SARCAT" DC 1011 [triaryl sulfonium hexafluorophosphate (50% n-propylene carbonate)], "SARCAT" DC 1012 (diaryl iodonium hexafluoroantimonate), and "SARCAT" K185 [triaryl sulfonium hexafluorophosphate (50% in propylene carbonate)].

The b-stageable heat curable composition may further include in the range of about 20 up to 90 wt % filler, based on the total weight of the composition.

Fillers contemplated for use in the practice of the present invention may optionally be conductive (electrically and/or thermally).

Electrically conductive fillers contemplated for use in the practice of the present invention include, for example, silver, nickel, gold, cobalt, copper, aluminum, graphite, silver-coated graphite, nickel-coated graphite, alloys of such metals, and the like, as well as mixtures thereof. Both powder and flake forms of filler may be used herein. In flake form, the filler may have a thickness of less than about 2 microns, with planar dimensions of about 20 to about 25 microns. Flake employed herein may have a surface area of about 0.15 to 5.0 $m^2/g$ and a tap density of about 0.4 up to about 5.5 g/cc. In powder form, the filler particles may have a diameter of about 0.5 to 30 microns, such as about 20 microns.

Thermally conductive fillers contemplated for use in the practice of the present invention include, for example, aluminum nitride, boron nitride, silicon carbide, diamond, graphite, beryllium oxide, magnesia, silica, alumina, and the like.

Electrically and/or thermally conductive fillers should be rendered substantially free of catalytically active metal ions by treatment with chelating agents, reducing agents, non-ionic lubricating agents, or mixtures of such agents. Such treatment is described in U.S. Pat. No. 5,447,988, which is expressly incorporated by reference herein in its entirety.

Optionally, a filler may be used in addition to or as an alternative to the conductive filler, that is neither electrically nor thermally conductive. Such fillers may be desirable to impart some other phusical property to the formulation such as, for example, reduced thermal expansion of the cured composition, reduced dielectric constant, improved toughness, increased hydrophobicity, and the like. Examples of such fillers include perfluorinated hydrocarbon polymers (i.e., TEFLON), thermoplastic polymers, thermoplastic elastomers, mica, fused silica, glass powder, spacer elements and the like.

The b-stageable heat curable composition may be preapplied either (a) onto at least a portion of the opposed surface of the circuit chip or (b) onto at least a portion of bond pad of the substrate, at any thickness or amount which can achieve sufficient adhesion between the chip die and the substrate and which provides for appropriate properties therebetween during use of the thus integrated assembly.

The composition may be substantially free of non-reactive solvent or diluent, or depending on the constituents used may include a non-reactive solvent or diluent. When a diluent is added, it is desirable for the diluent to be a reactive diluent which, in combination with the maleimide-containing compound, forms a thermosetting resin composition. Such reactive diluents include acrylates and methacrylates of monofunctional and polyfunctional alcohols, vinyl compounds as described in greater detail herein, styrenic monomers (i.e., ethers derived from the reaction of vinyl benzyl chlorides with mono-, di-, or trifunctional hydroxy compounds), and the like.

Exemplary coupling agents contemplated for use in the practice of the present invention include silicate esters, metal acrylate salts (e.g., aluminum methacrylate), titanates (e.g., titanium methacryloxyethylacetoacetate triisopropoxide), or compounds that contain a copolymerizable group and a chelating ligand (e.g., phosphine, mercaptan, acetoacetate, and the like). Generally in the range of about 0.1 up to 10 wt % of at least one coupling agent (based on the total weight of the organic phase) will be employed, within the range of about 0.5 up to 2 wt % preferred.

Certain desirable coupling agents contain both a co-polymerizable function (e.g., vinyl moiety, acrylate moiety, methacrylate moiety, styrene moiety, cyclopentadiene moiety, and the like), as well as a silicate ester function. The silicate ester portion of the coupling agent is capable of condensing with metal hydroxides present on the mineral surface of the substrate, while the co-polymerizable function is capable of co-polymerizing with the other reactive components of invention adhesive composition. An example of such a coupling agent is an oligomeric silicate coupling agent, such as poly(methoxyvinylsiloxane).

Other particularly desirable coupling agents include those represented by the structure:

where each A is independently a free-radically polymerizable group; each L is independently a covalent bond or a polyvalent organic radical; each Z is independently a reactive moiety which forms hydrogen and/or covalent bond(s) with substrates having free hydroxyl groups on the surface thereof, a is 1–200, and b is 1-200.

Free-radically polymerizable groups, A, include optionally substituted maleimides, optionally substituted vinyl ethers, optionally substituted vinyl thioether, optionally substituted vinyl esters, optionally substituted fumarates, optionally substituted vinyl thioester, optionally substituted diallyl amides, optionally substituted styrene functional groups, optionally substituted polybutadienyl, and the like. These functional groups can co-cure by a free-radical mechanism with bismaleimide or acrylate resin systems when catalyzed by a small amount of free-radical inhibitor. Alternatively, such functional groups can also co-cure with maleimide or acrylate resin systems without using a free radical initiator if the system is exposed to elevated cure temperatures, UV radiation, or the like.

The inventive b-stageable heat curable composition may further contain other additives, such as defoaming agents, leveling agents, dyes, and pigments.

Figure 2:
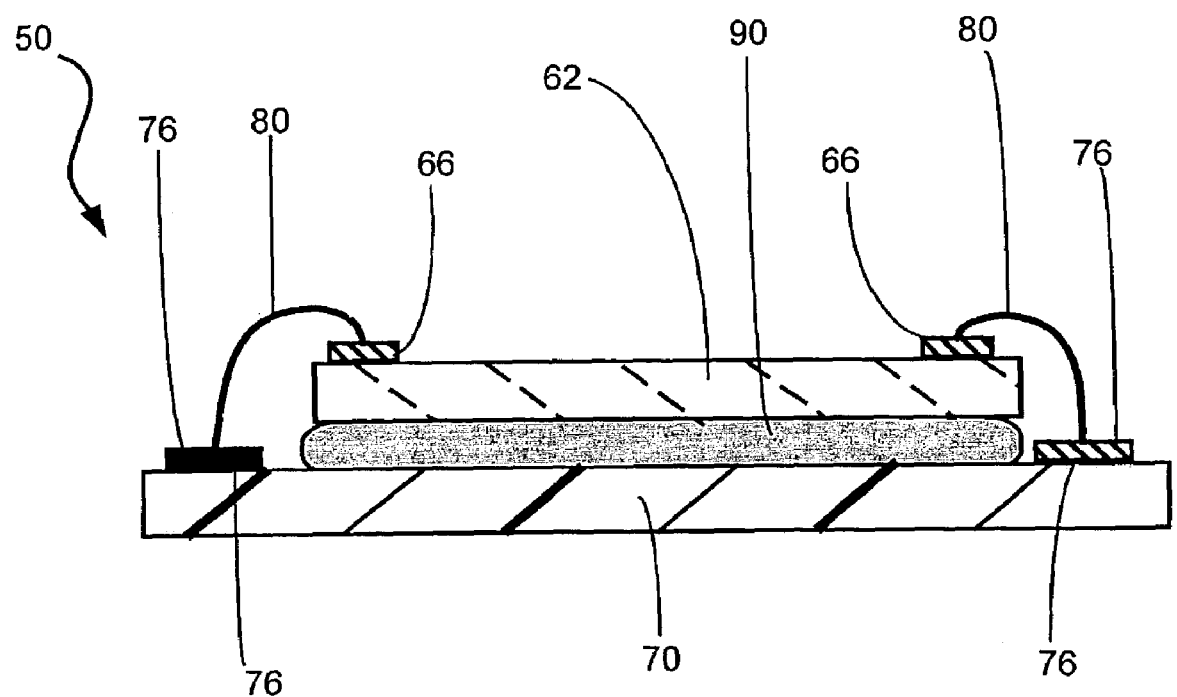
FIG. 2 is a schematic representation of a circuit assembly including the semiconductor chip of FIG. 1 assembled to a substrate.

Referring to the drawings in which like reference characters refer to like parts throughout the several views thereof, a circuit assembly 50 is depicted in FIGS. 1 and 2. Generally speaking, circuit assembly 50 includes a semiconductor chip with the die attach adhesive preapplied onto the die backside 60, and a carrier substrate such as circuit board substrate 70.

Circuit chip 60 includes a chip die 62. Chip die 62 may be constructed of any material known in the art. For example, chip die 62 may be constructed of silicon, germanium, or the like. Chip die 62 may also be coated with a passivation material, which is capable inhibiting environmental corrosion, such as a polyimide-, poly-benzocyclobutane-, or silicone nitride-based material.

Substrate 70 may also be constructed of any material known in the art. For example, substrate 70 may be constructed from ceramic substrates including $Al_2O_3$, silicon nitride ($SiN_3$), and mullite ($Al_2O_3$—$SiO_2$); substrates or tapes of heat-resistant resins, such as polyimides; substrates of glass-reinforced epoxy; substrates of acrylonitrile-butadiene-styrene (ABS); and phenolic substrates, substrates made metallic materials such Cu, Alloy 42, and the like with various surface finishes such as spot Ag plating, Pd, flash Au and the like. Substrate 70 includes circuitry on a substrate surface 74, including a plurality of electrical bond pads 76.

Chip die 62 includes opposing first and second surfaces, including chip surface 64 as a first surface and attach surface 68 as a second surface. Circuitry is provided on chip surface 64, including a plurality of electrical contact pads, such as metallized bond pads 66, which are arranged in a predetermined pattern. These electrical contact pads are connectable to the bond pads 76 of the substrate 70. The electrical interconnection and engagement between the circuitry on chip die 62 and the circuitry on substrate 70 is provided by way of bonds between each of contact pads 66 on chip die 62 and contact pads 76 of substrate 70, established such as by wire(s) 80. Electrical interconnection can be established by bonding wire 80 to contact pads 76 after curing of the die attach material. While the present figures depict two wires 80 bonded on chip die 62 and two corresponding contact pads 76 on substrate 70 for purposes of demonstrating the present invention, it is understood that the number of wire bonds and contact pads 76 may be varied according to the particular desired use and the particular configuration of the circuit chip, and the specific configuration depicted herein should not be considered as limiting of the present invention.

In the present invention, chip die 62 includes metallized electrical contacts in the form of contact pads 66 on chip surface 64, and includes b-stageable die attach adhesive 90 preapplied on the opposing attach surface 68 prior to assembly of chip die 62 with substrate 70. B-stageable die attach material 90 provides circuit assembly 50, after exposure to appropriate curing conditions, with high adhesive strength for adhering chip die 62 to substrate 70. Ordinarily, such adherence occurs by forming a fully cured material in a solid form for attaching and adhering chip die 62 to substrate 70, through exposure to elevated temperature conditions sufficient to promote b-stage curing of the b-stageable die attach adhesive 90.

The present invention further provides circuit assembly 50 in an assembled form, as depicted in FIG. 2, in which chip die 62 has been mated with substrate 70, and exposed to appropriate conditions to cause the b-stageable die attach adhesive 90 to attach and adhere chip die 62 to substrate 70. Also, chip die 62 can then be electrically interconnected with substrate 70 through an electrical interconnection established between contact pads 66 and contact pads 76, such as by soldering or otherwise bonding wires 80 therebetween.

The present invention thus provides, in one embodiment, an article of manufacture in the form of a chip die having a first surface capable of providing electrical engagement with another chip die or a carrier substrate to which it is intended to be electrically interconnected, and a second surface, opposed from the first, and having a b-stageable die attach adhesive disposed on at least a portion thereof. Providing the b-stageable die attach adhesive directly onto a surface of the chip die, eliminates production issues with dispensing volumes and temperatures, and storage, handling and shelf life issues, as well that are often considered with flowable or liquid die attach adhesives. That is, the end user no longer needs to use sophisticated dispensing equipment and low temperature storage containers for application of such materials. Instead, the end user can now use either a semiconductor chip or a semiconductor wafer with b-stageable die attach adhesive preapplied onto at least a portion of a surface thereof, according to the present invention and assemble the semiconductor device with increased ease and throughput.

A semiconductor chip preapplied with a b-stageable die attach adhesive also enables the end user to implement tighter package design specifications. That is, because of reduced flowout and bleed from such b-stageable die attach adhesive as contrasted to many known die attach adhesives, tighter tolerances between die edge and bond may be realized. In addition, semiconductor chips may now be stacked, such that the overall size of the semiconductor device may be reduced, or at least remain substantially the same in the length and width directions, yet the performance capabilities of the stacked semiconductor chips may be increased dramatically. See e.g. U.S. Pat. Nos. 5,323,060, 5,286,679, 5,140,404, and 6,465,893, the disclosures of each of which hereby expressly incorporated herein by reference.

Moreover, whereas many conventional die attach adhesives benefit from tighter processing controls to avoid kerf creep and contact bond pad contamination during bonding of thin dice, no such precautions are necessalry when b-stageable die attach adhesive of the present invention are used. Again, this affords the package designer with much greater design flexibility and capability.

The inventive b-stageable die attach adhesives may be applied by stencil printing, screen printing or spray coating.

In the case of stencil printing or screen printing onto pre-diced wafers, the wafers can be uniformly coated with the inventive die attach adhesives and thereafter cured. During wafer dicing, the dicing saw then cuts completely through the cured die attach adhesive layer and the wafer.

In the case of stencil printing or screen printing onto diced wafers, the stencil or screen is made with apertures designed to partially coat the individual die or semiconductor chips. Specifically, the webbing of the stencil or screen is used to maintain the inventive die attach adhesive in place. That is, it is undesirable for the die attach adhesive to enter into the dicing streets, which would facilitate die separation during die placement. The width of the webbing, or conversely, the dimensions of the aperture, are designed so that after die placement, the target wet bondline may be achieved and the die attach adhesive may form fillets of the desired height beneath the die.

In the case of stencil printing or screen printing onto laminate substrates, the stencil or screen is made with apertures designed to partially coat the die pad. Specifically, the webbing of the screen or stencil is used to maintain in place the die attach adhesive after die placement. The width of the webbing, or conversely, the dimensions of the aperture, are designed so that after die placement, the target wet bondline may be achieved and the die attach adhesive may form fillets of the desired height beneath the die with minimal to no wetting by the die attach adhesive of the electrically conductive interconnects.

In the case of application onto laminate substrates, a "zero gap bondline" may be achieved with the inventive die attach adhesive. For instance, the laminate may first manufactured without a solder mask layer over the die pad. Thus, the die pad area is lower in height relative to the non-die pad areas by a depth equal to the thickness of the solder mask layer, which is typically around 1 mil. These recessed die pads are then filled with the die attach adhesive, using stencil printing, screen printing or spray coating.

Preferably, an amount of the inventive b-stageable die attach adhesive is applied until the surface of the applied adhesive is flush with the solder mask layer. The recessed die pad is not completely filled in with the die attach adhesive; rather, an amount of the die attach adhesive is used such that after die placement, the die attach adhesive has flowed underneath the die to cover the previously exposed die pad bottom. This method allows for semiconductor packaging manufacturers to achieve thinner packages without changing the bondline adhesive.

Alternatively, the inventive b-stageable die attach adhesive adhesive may be used as a replacement for solder mask, whether inside or outside the diepad area, or both.

In the case of spray coating, thin semiconductor wafers are desirable substrates on which to coat the die attach adhesive. These thin semiconductor wafers have typical thickness of about 2–3 mil. Although mechanically robust once properly supported, i.e., bonded onto flexible subtrates and encapsulated or overmolded, in their unsupported form thin dice derived from these wafers are fragile and break rather easily. It is therefore advantageous that a method for applying die attach adhesive onto thin wafers apply minimal force while doing so.

After the inventive b-stageable die attach adhesive has been applied onto the wafer or die using any of the above methods, the adhesive may then be dried to remove solvent, if present, or cooled to solidify the adhesive, if applied under mildly elevated temperature conditions.

A typical drying time may be about 30 minutes at a temperature of about 100° C., though any temperature below the cure onset of the curable componenets of the b-stageable die attach adhesive may be chosen. The length of time may vary depending on the time required for the surface of the die attach adhesive to become tack free at the chosen temperature.

Any time after the surface of the die attach adhesive is tack free (either by drying or cooling), die bonding may occur.

Conditions suitable for curing the b-stageable die attach adhesive include subjecting the inventive adhesive to a temperature of at least about 175° C. but less than about 300° C. for about 0.5 up to about 2 minutes. A typical die bonding setting is a time of about 10 seconds at a temperature of about 100° C. using 500 cN spread, in the case of a 7.6 mm×7.6 mm die. This rapid, short duration heating can be accomplished in a variety of ways, e.g., with in-line snap cure stations such as those manufactured by Nihon Sanso, a heated stage mounted on the diebonder, or an IR beam provided by an EFOS Novacure IR unit.

In the case of a stacked die assembly (described below with reference to FIG. 4; see also U.S. Pat. Nos. 5,323,060, 5,286,679, 5,140,404, and 6,465,893, the disclosures of each of which hereby expressly incorporated herein by reference), it may be advantageous to heat the die before die placement by pulsing heat through the die collet, which is an available feature in film diebonders, such as those manufactured by ESC. In the case of thin die which are typically warped due to the build-up of residual mechanical stress during the grinding process, heating the die above a certain temperature oftentimes anneals the die and thus reduces warpage.

Figure 3:
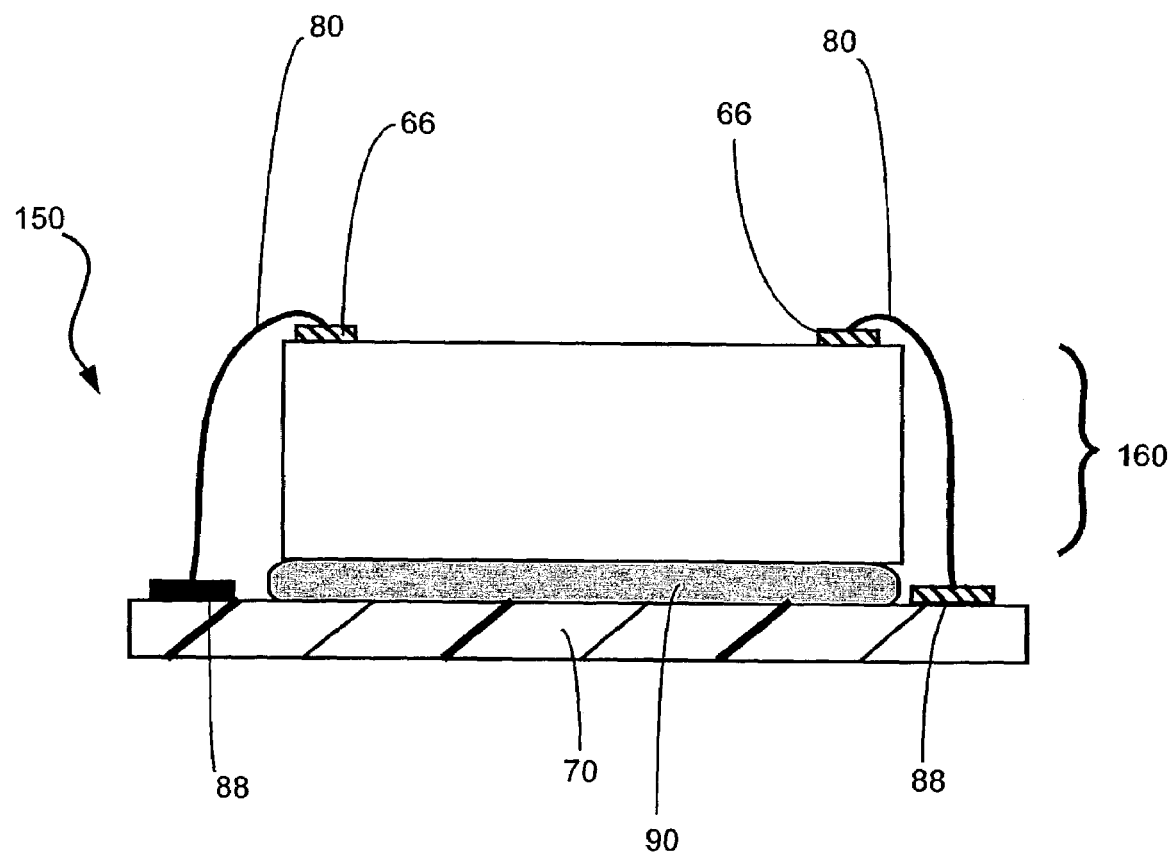
FIG. 3 is a schematic representation of a circuit assembly including a semiconductor chip assembled to a chip scale package in a further embodiment of the present invention.

It is noted that chip die 62 as discussed herein may be provided as an individual chip die, or may be provided as a chip scale package, such as depicted as 160 in FIG. 3. Accordingly, in FIG. 3, a circuit assembly 150 is provided including a chip scale package 160. Chip scale packages are known in the art for use in electrical connections of circuits with circuit board substrates. In the present embodiment, circuit assembly 150 includes a structure similar to that shown in the embodiment depicted in FIG. 2, except that chip die 62 is replaced with chip scale package 160. For example, circuit assembly 150 includes a circuit board substrate 70 including contact pads 76 thereon. Substrate 70 is attached to chip scale package 160, which may include, for example, a chip die attached to a separate carrier substrate or an interposer layer, as is known in the art. In such an embodiment, contact pads 66 and/or wires 80 may be provided on such a separate carrier substrate or on the interposer layer, in a similar manner as set forth with respect to circuit chip 60 in the previous description. Moreover, chip scale package 160 is attached to substrate 70 in a similar manner as with the previous description, through die attach material 90.

Figure 4:
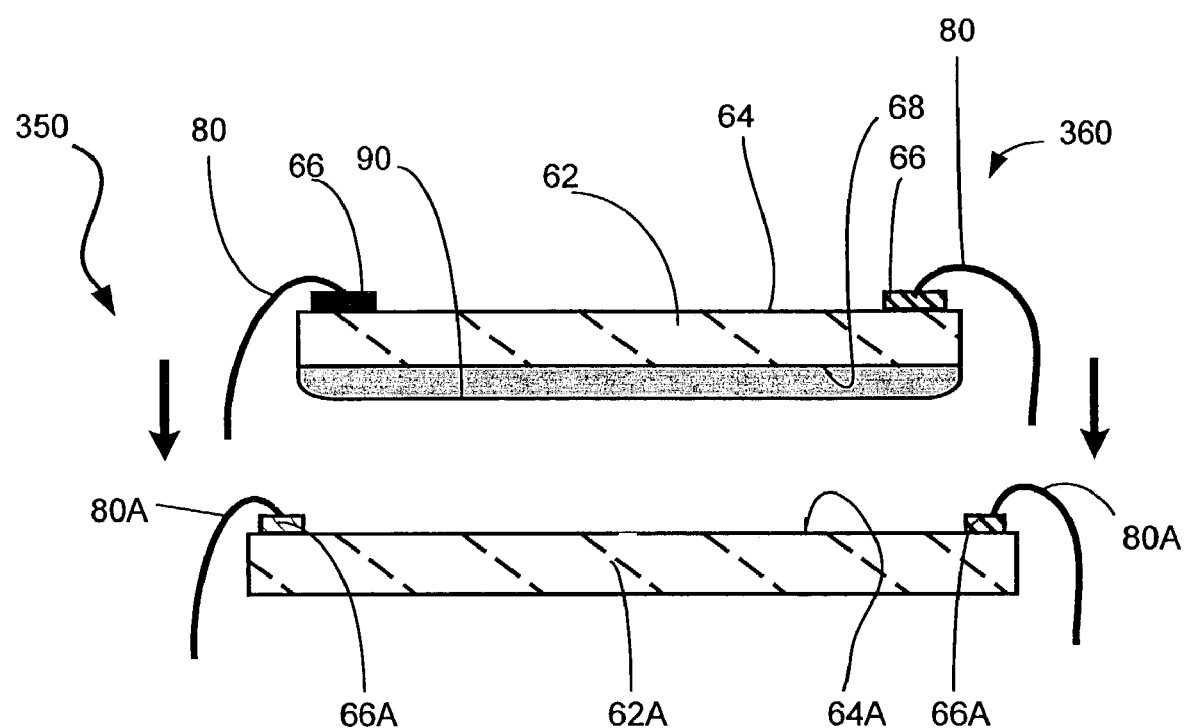
FIG. 4 is a schematic representation of a stacked chip die application.

And in the context of a stacked die application, FIG. 4 depicts a cross sectional view of two dies stacked in a stacked die assembly 350 includes a semiconductor chip in the form of preapplied die attach circuit chip 360 (having chip die 62 and inventive b-stageable die attach adhesive 90 disposed thereon), and an other chip die 62A, to which preapplied die attach circuit chip 360 will be attached.

Circuit chip 360 includes a chip die 62, as above with reference to FIG. 1. Like chip die 62, the other chip die 62A may be constructed of any material known in the art, and may be constructed from the same of different materials.

The other chip die 62A includes opposing first and second surfaces, including chip surface 64A as a first surface which is the attach surface for chip die 62. Electrical contact pads, such as metallized contact pads 66A, which are arranged in a predetermined pattern, are connectable to the contact pads of a substrate or another chip die (neither of which shown). The electrical interconnection and engagement between the circuitry on chip die 62 and the circuitry on the other chip die 62A is provided by way of bonds between each of contact pads 66 on chip die 62 and contact pads 66A of the other chip die 62A, established such as by wire(s) 80. Electrical interconnection can be established by bonding wire 80 to contact pads 66A before or, more preferably, after curing of the b-stageable die attach adhesive. Alternatively, electrical interconnection can be established by bonding wire 80 to contact pads ditrectly on the substrate 70. While the present figures depict two wires 80 bonded on chip die 62 and two corresponding contact pads 66A on the other chip die 62A for purposes of demonstrating the present invention, it is understood that the number of wire bonds and contact pads 66A may be varied according to the particular desired use and the particular configuration of the circuit chip, and the specific configuration depicted herein should not be considered as limiting of the present invention. (See also U.S. Pat. No. 5,323,060.)

The present invention will be more readily appreciated with reference to the examples which follow.

EXAMPLES

Example 1

A b-stageable die attach adhesive was prepared using the components listed below in the noted amounts. The maleimides were prepared according to the procedure set forth in U.S. Pat. No. 5,973,166, the disclosure of which is hereby expressly incorporated herein by reference.

| | |
|---|---|
| Dodecylbismaleimide | 69.3 g |
| X-BMI[1] | 10.8 g |
| RICON 130[2] | 2.9 g |
| 2-Phenoxyacrylate | 15.8 g |
| Coupling agent[3] | 1.0 |
| Peroxide[4] | 0.2 g |

[1]X-BMI (the 1,20-bismaleimido derivative of 10,11-dioctyl-eicosane), was prepared according to the procedure set forth in U.S. Pat. No. 5,973,166, the disclosure of which is hereby expressly incorporated herein by reference.
[2]Polybutadiene 20% grafted with maleic anhydride (commercially available from Sartomer).
[3]Beta-3,4-epoxycyclohexyl)ethyltrimethoxy silane.
[4]Di(4-t-butylcycohexyl)peroxydicarbonate.

The b-stageable die attach adhesive was mixed thoroughly after the addition of each component at room temperature, dispensed onto a glass slide, and heated to a temperature of 90° C. for 10 minutes, followed by heating to a temperature of 125° C. for 1 minute.

The b-staged die attach adhesive was heated to a temperature of 125° C. to 130° C. for less than 60 seconds, and silicon die was placed thereover. The silicon die was then attached to the glass slide by heating at a temperature of 150° C. for a period of time of 1 hour.

The b-staged die attach adhesive was then evaluated for room temperature die shear and hot die shear on a calibrated Dage 4000 die shear tester. The room temperature die shear was observed to be greater than 100 Kg-f, and the hot die shear was observed to be 45+/−19.

Example 2

A b-stageable die attach adhesive was prepared using the components listed below in the noted amounts. As above, the maleimides were prepared according to the procedure set forth in U.S. Pat. No. 5,973,166.

| | |
|---|---|
| Dodecylbismaleimide | 68.6 g |
| X-BMI | 10.7 g |
| RICON 130 | 23.0 g |
| 2-Phenoxyacrylate | 15.6 g |
| Coupling agent | 0.8 |
| Peroxide[5] | 12 g |

[5]Cumyl hydroperoxide.

The b-stageable die attach adhesive was mixed thoroughly after the addition of each component at room temperature, dispensed onto a glass slide, and heated to a temperature of 90° C. for 10 minutes, followed by heating to a temperature of 125° C. for 1 minute.

The b-staged die attach adhesive was heated to a temperature of 125° C. to 130° C. for less than 60 seconds, and silicon die was placed thereover. The silicon die was then attached to the glass slide by heating at a temperature of 150° C. for a period of time of 1 hour.

The b-staged die attach adhesive was then evaluated for room temperature die shear and hot die shear on a calibrated Dage 4000 die shear tester. The room temperature die shear was observed to be greater than 100 Kg-f, and the hot die shear was observed to be 63+/−23.

Example 3

A silver-filled b-stageable die attach adhesive was prepared using the components listed below in the noted amounts. As in example 1, the maleimides were prepared according to the procedure set forth in U.S. Pat. No. 5,973,166.

| | |
|---|---|
| Dodecylbismaleimide | 9.4 g |
| X-BMI | 3.35 g |
| BMI citriconamide | 5.7 g |
| RICON 130 | 2.9 g |
| 2-Phenoxyacrylate | 4.9 g |
| Coupling agent | 0.25 |
| Peroxide[6] | 0.1 g |
| Silver filler[7] | 75.5 g |

[6]Di(4-t-butylcycohexyl)peroxydicarbonate.
[7]Particle size between 1 and 50 microns.

The b-stageable die attach adhesive was mixed thoroughly after the addition of each component at room temperature, dispensed onto a glass slide, and heated to a temperature of 90° C. for 10 minutes, followed by heating to a temperature of 125° C. for 1 minute.

The b-staged die attach adhesive was heated to a temperature of 125° C. to 130° C. for less than 60 seconds, and a silicon die was placed thereover. The silicon die was then attached to the glass slide by heating at a temperature of 150° C. for a period of time of 1 hour.

The b-staged die attach adhesive was then evaluated for room temperature die shear and hot die shear on a calibrated Dage 4000 die shear tester. The room temperature die shear was observed to be greater than 100 Kg-f, and the hot die shear was observed to be 51+/−13.

Example 4

Another silver-filled b-stageable die attach adhesive was prepared using the components listed below in the noted amounts. Again as in example 1, the maleimides were prepared according to the procedure set forth in U.S. Pat. No. 5,973,166.

| | |
|---|---|
| Dodecylbismaleimide | 7.6 g |
| X-BMI | 2 g |
| RICON 130 | 1.3 g |
| Dicyclopentadienyl MA | 4.5 g |
| Bisphenol A Di(meth)acrylate | 2.3 g |
| Coupling agent | 1.3 g |
| Peroxide | 1 g |
| Silver filler | 80 g |

The b-stageable die attach adhesive was mixed thoroughly after the addition of each component at room temperature, and determined to have a 1 rpm viscosity of 349,000 cps. The b-stageable die attach adhesive was dispensed onto a glass slide, and heated to a temperature of 125° C. for 5 minutes.

The b-staged die attach adhesive was heated to a temperature of 175° C. for one hour. At this point, the cured die attach adhesive was allowed to cool to room temperature, and its volume resistivity was determined to be 0.00023 ohms-cm.

The b-stageable die attach adhesive was screen printed onto a ceramic substrate, and heated to a temperature of 125° C. for 5 minutes. The b-staged die attach adhesive was allowed to cool to room temperature. The b-staged die attach adhesive was heated to a temperature of 125° C. to allow for the solid component to melt so that a silicon die may be placed thereover. The assembly was bonded together by heating at a temperature of 175° C. for a period of time of one hour.

The b-staged die attach adhesive was then evaluated for hot die shear at 275° C. on a calibrated Dage 4000 die shear tester. The hot die shear was observed to be 46+/−about 10.

What is claimed is:

1. A b-stage curable composition comprising:
   a. a solid component heat curable at a first temperature;
   b. a liquid component, which is either heat curable at a second temperature or curable upon exposure to radiation in the electromagnetic spectrum; and
   c. a heat cure catalyst for the solid curable component, wherein the liquid curable component comprises epoxies, episuldides, maleimides, nadimides, itaconimides, (meth)acrylate, vinyl ethers, vinyl esters, styrene and derivatives thereof, poly(alkenylene)s, allyl amides, norbornenyls, thiolenes, and combinations thereof.

2. The composition of claim 1, wherein the solid curable component has a melting point range that is less than the temperature at which the solid curable component cures.

3. The composition of claim 1, wherein the solid curable component has a melting point range that is substantially the same as the temperature at which the solid curable component cures.

4. The composition of claim 1, further comprising a reactive diluent.

5. The composition of claim 1, wherein the composition is substantially free of non-reactive solvent.

6. The composition of claim 1, further comprising solvent.

7. The composition of claim 1, further comprising a filler.

8. The composition of claim 7, wherein the wherein the filler is conductive.

9. The composition of claim 7, wherein the filler is thermally conductive.

10. The composition of claim 7, wherein the filler is electrically conductive.

11. The composition of claim 7, wherein the filler is nonconductive.

12. The composition of claim 7, wherein me filler has a particle size of less than about 50 microns.

13. The composition or claim 1, further comprising a photoinitiator.

14. The composition of claim 13, wherein the photoinitiator is selected from the group consisting of catalysts triggered by radiation in the UV, UV/VTS VIS, IR, E-beam, X-ray, and microwave ranges of the electromagnetic spectrum.

15. A b-stage curable composition comprising:
a. a solid component heat curable at a first temperature;
b. a liquid component, which is either heat curable at a second temperature or curable upon exposure to radiation in the electromagnetic spectrum; and
c. a heat cure catalyst for the solid curable component, wherein the heat cure catalyst is selected from the group consisting of free radical catalysts, anionic curatives, cationic curatives, and combinations thereof, wherein the free radical catalyst is a member selected from the group consisting of peroxides, azo compounds, and combinations thereof.

16. The composition of claim 15, wherein the free radical catalyst is a member selected from the group consisting of peroxides, azo compounds, and combinations thereof, wherein the anionic curative is a member selected from the group consisting of aza compounds, amine compounds, imidazole compounds, and combinations thereof.

17. The composition of claim 15, wherein the anionic curative is a member selected from the group consisting of aza compounds, amine compounds, imidazole compounds, and combinations thereof, wherein the aza compounds are members selected from the group consisting of

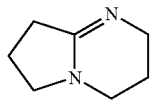

1,5-Diazabicyclo [4.3.0]non-5-ene

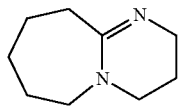

1.8-Diazabicyclo [5.4.0]undec-5-ene (DBU)

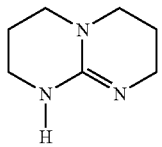

1,5,7-Triazabicyclo [4.40]dec-5-ene

Quinuclidine

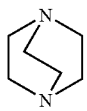

1,4-Diazabicyclo [2.2.2]octane.

18. The composition of claim 17, wherein the amine compounds are members selected from the group consisting of aliphatic polyamines, aromatic polyamines, alicyclic polyamines, and combinations thereof.

19. The composition of claim 17, wherein the amine compounds are members selected from the group consisting of diethylenetriamine, triethylenetetraamine, diethylaminopropylamine, benzyl dimethylamine, m-xylenediamine, diaminodiphenylamine, quinoxaline, isophoronediamine, menthenediamine and combinations thereof.

20. The composition of claim 17, wherein the imidazole compounds are members selected from the group consisting of isoimidazole, imidazole, 2ethyl-4-methylimidazole, 2,4dimethylimidazole, butylimidazole, 2-heptadecenyl-4-methylimidazole, 2methylimidazole, 2-undecenylimidazole, 1-vinyl-2-methylimidazole, 2-undecylimidazole, 2-heptadecylimidazole, 2-phenylimidazole, 1-benzyl-2-methylimidazole, 1-propyl-2-methylimidazole, 1-cyanoethyl2methylimidazole, 1-cyanoethyl-2ethyl4 methylimidazole, 1-cyanoethyl-2-undecylimidazole, 1-cyanoethyl 2-phenylimidazole, 1-guanaminoethyl-2-methylimidazole, addition products of an imidazole and methylimidazole, addition products of an imidazole and trimellitic acid, 2-n-heptadecyl-4-methylimidazole, phenylimidazole, benzylimiclazoie, 2-methyi-4,5-diohenylimidazole, 2,3,5-triphenylimidazole, 2-styrylimidazole, 1-(dodecyl benzyl)-2-methyilmidazole, 2-(2-hydroxyl-4-t-butyiphenyl)-4,5-diphenylimidazole, 2-(2-methoxyphenyl)-4,5-diphenylimidazole, 2-(3-hydroxyphenyl)-4,5-diphenylimidazole, 2-(p-dimethylaminophenyl)-4,5-diphenylimidazole, 2-(2-hydroxyphenyl)-4,5-diphenylimidazole, di(4,5-diphenyl-2-imidazole) benzene-1,4, 2-naphthyl-4,5-diphenylimidazole, 1-benzyl-2-methylimidazole, 2-p-methoxystyrylimidazole, and combinations thereof.

21. A stage curable composition comprising:
a. a solid component heat curable at a first temperature;
b. a liquid component, whicn is either heat curable at a second temperature or curable up on exposure to radiation in the electromagnetic spectrum; and
c. a heat cure catalyst for the solid curable component, wherein the cationic curative is a member selected from the group consisting of organic acids, anhydrides, Lewis acids, and combinations thereof, wherein the heat cure catalyst. is selected from the group consisting of free radical catalysts, anionic curatives, cationic curatives, and combinations thereof.

22. The composition of claim 21, wherein the organic acid is a member selected from the group consisting of phenols, thiophenols, thiols, carboxylic acids, and combinations thereof.

23. A b-stage curable composition comprising:
a. a solid component heat curable at a first temperature;
b. a liquid component, whicn is either heat curable at a second temperature or curable upon exposure to radiation in the electromagnetic spectrum; and
c. a heat cure catalyst for the solid curable component, further comprising a second heat cure catalyst for the liquid curable component.

24. The composition of claim 23, wherein cure of the liquid curable component by the second heat cure catalyst occurs at a temperature within the range of about 50° C. to about 150° C. and cure of the solid curable component by the first heat cure catalyst occurs at a temperature wirhin the grange of about 100° C.to about 300° C.

25. The composition of claim 23, wherein cure of the lipuid curable component by the second heat cure catalyst occurs at a temperature iess than about 100° C. and cure of the solid curable component by the first heat cure catalyst occurs at a temperature above about 100° C.

26. A b-stage curable composition comprising:
   a. a solid component heat curable at a first temperature;
   b. a liquid component, which is either heat curable at a second temperature or curable upon exposure to radiation in the electromagnetic spectrum; and
   c. a heat cure catalyst for the solid curable component, wherein the solid curable component comprises one or more of a group of epoxies, episulfides, maleimides, nadimides, itaconinides, (meth)acrylate, vinyl ethers, vinyl esters, styrene and derivatives thereof, poly(alkenylene)s, allyl amides, norbornenyls, thiolenes, and combinataons thereof.

27. A b-stage curable composition comprising:
   a. a solid component heat curable at a first temperature;
   b. a liquid component, which is either heat curable at a second temperature or curable up on exposure to radiation in the electromagnetic spectrum; and
   c. a heat cure catalyst for the solid curable component, wherein the liquid curable component is a member selected from the group consisting of a maleimide-containing compound, a nadimide-containing compound or a itaconimide-contaning compound comprising

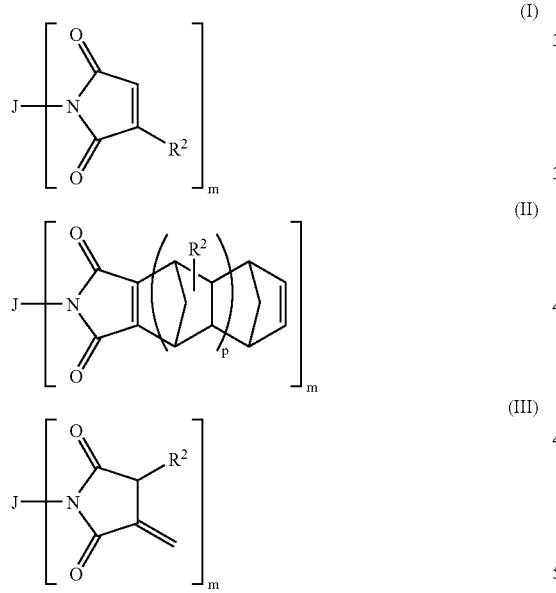

wherein:
m=1–15,
P=0–15,
each $R^2$ is independently selected from hydrogen or lower alkyl, and
J is a monovalent or a polyvalent moiety comprising organic or organosiloxane radicals, and combinations of two or more thereof.

28. A b-stage curable composition comprising:
   a. a solid component heat curable at a first temperature;
   b. A liquid componet, which is either heat curable at a second temperature or curable upon exposure to radiation in the electromagnetic spectrum; and
   c. a heat cure catalyst for the solid curable component, wherein the liquid curable component is a member selected from the group consisting of a maleimide-containing compound, a nadimide-contaning compound or a itaconimide-containing compound comprising structures I, II and III, wherein
m=1–6,
p=0,
$R^2$ is independently selected from hydrogen or lower alkyl, and
J is a monovalent or polyvalent radical selected from hydrocarbyl, substituted hydrocarbyl, heteroatom-containing hydrocarbyl, substituted heteroatom-containing hydrocarbyl, hydrocarbylene, substituted hydrocarbylene, heteroatom-containing hydrocarbylene, substituted heteroatom-containing hydrocarbylene, polysiloxane, polysiloxane-polyurethane block copolymer, and combinations of two or more thereof, optionally containing one or more linkers selected from a covalent bond, -O-, -S-, -NR-, -O-C(O)-, -O-C(O)-O-, -OC(O)-NR-, -NR-C(O)-, -NR-C(O)-O-, -NR-C(O)-NR-, -S-c(O)-, -S-C(O)-O-, -S-C(O)-NR-, -S(O)-, -S(O)$_2$-, -O-S(O)$_2$-, -O-S(O)$_2$-O-, -OS(O)$_2$-NR-, -O-S(O)-, -O-S(O)-O-, -O-S(O)-NR-, -O-NR-C(O)-, -O-NR-C(O)-O-, -O-NR-C(O)-NR-, -NR-O-C(O)-, -NR-O-C(O)-O-, -NR-O-C(O)-NR-, -NR-O-C(S)-O_, -NR-O-C(S)-NR-, -O-(S)-, -O-C(S)-O-, -O-C(S)-NR-, -NR-C(S)-, -NR-C(S)-O-, -NR-C(S)-NR-, -S-S(O)$_2$-, -S-S(O)$_2$-O-, -S-S(O0$_2$-NR-, -NR-O-S(O)-, -NR-O-S(O)-O-, -NR-O-S(O)-NR-O-S(O)$_2$-, -NR-O-S(O)$_2$-O-, -NR-O-S(O)$_2$NR-, -O-NR-S(O)-, -O-NR-S(O)-O-, -O-NR-S(O)-NR-, -O_NR-S(O)$_2$-O-, -O-NR-S(O)$_2$-NR-, -O-NR-S(O)$_2$-, -O-P(O)R$_2$-, -S-P(O)R$_2$-, -NR-P(O)R$_2$-, wherein each R is independently hydrogen, alkyl or substituted alkyl, and combinations of any two or more thereof.

29. A b-stage curable composition comprising:
   a. a solid component heat curable at a first temperature;
   b. a liquid component, which is either heat curable at a second temperature or curable upon exposure to radiation in the electromagnetic spectrum; and
   c. a heat cure catalyst for the solid curable componet, wherein the solid curable component is a maleimide-containing compound, a nadimide-containing compound or a itaconimide-contaning compound in the solid state at room temperature.

30. The compositin of claim 29, wherein the maleimide-containing compound, the itaconimide-containing compound or the nadimide-containing compound is a solid and is a member selected from the group consisting of:

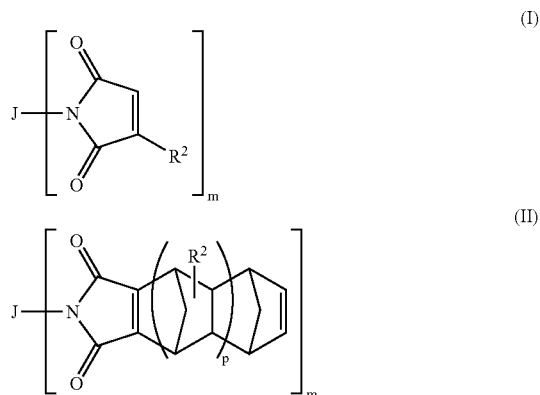

-continued

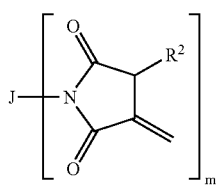

(III)

wherein:

m=1–15, p=0–,15 each $R^2$ is independently selected from hydrogen or lower alkyl, and

J is a monovalent or a polyvalent moiety comprising organic or organosiloxane radicals, and combinations of two or more thereof.

31. A b-stage curable composition comprising;

a. a solid component heat curable at a first temperature;

b. a liquid component, which is either heat curable at a second temperature or curable upon exposure to radiation in the electromagnetic spectrum; and c. a heat cure catalyst for the solid curable component, wherein the liquid component comprises one or more of the maleimide-containing compound, the nadimide-containing compound or the itaconimide-containing compound comprises a maleimide functional group, nadimide functional group or itaconimide functional group respectiveley, attached to a monovalent radical or maleimide functional groups, nadimide functional groups or itaconimide functional groups separated by a polyvalent radical, each of the monovalent radical or the polyvalent radical having sufficient length and branching to render the maleimide-containing compound, the nadimide-containing compound or the itaconimide-containing compound respectively, a liquid.

32. A method of preparing the composition of claim 1, the steps of which comprise a. providing a solid curable component heat curable at a first temperature, a liquid curable component, which is either heat curable at a second temperature or curable upon exposure to radiation in the electromagnetic spectrum, and a heat cure catalyst for the solid curable component; and b. mixing together the solid curable component, liquid curable component and the heat cure catalyst.

33. The method of claim 32, further comprising c. exposing the composition to conditions favorable to effect cure of the liquid curable component.

34. The method of claim 33, further comprising d. exposing the composition to a temperature condition sufficient to melt the solid curable component.

35. The method of claim 34, further comprising e. exposing the compostion to a temperature condition sufficient to cure the melted, solid curable componet.

* * * * *